(12) United States Patent
Lawson et al.

(10) Patent No.: US 7,306,707 B2
(45) Date of Patent: Dec. 11, 2007

(54) ADAPTABLE PROCESSING ELEMENT FOR A PROCESSING SYSTEM AND A METHOD OF MAKING THE SAME

(75) Inventors: John Lawson, Chandler, AZ (US); Rodger Eckerson, Chandler, AZ (US); Michael Landis, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 694 days.

(21) Appl. No.: 10/454,747

(22) Filed: Jun. 4, 2003

(65) Prior Publication Data

US 2004/0245097 A1    Dec. 9, 2004

(51) Int. Cl.
*C23C 14/34* (2006.01)
*C23C 16/00* (2006.01)

(52) U.S. Cl. .................... 204/298.11; 204/298.07; 118/715; 118/720; 156/345.33; 156/345.43

(58) Field of Classification Search ........... 204/298.11, 204/298.07; 118/715, 720, 723 E; 156/345.33, 156/345.43
See application file for complete search history.

(56) References Cited

U.S. PATENT DOCUMENTS

| | | | |
|---|---|---|---|
| 3,369,989 A * | 2/1968 | Kay et al. ............. | 204/298.09 |
| 4,915,564 A | 4/1990 | Eror et al. | |
| 4,964,617 A | 10/1990 | Lawrence | |
| 5,065,698 A * | 11/1991 | Koike .................... | 118/719 |
| 5,300,731 A * | 4/1994 | DeBaratolo et al. ....... | 174/492 |
| 5,630,917 A | 5/1997 | Guo | |
| 5,803,977 A | 9/1998 | Tepman et al. | |
| 6,855,236 B2 * | 2/2005 | Sato et al. ............. | 204/298.11 |

FOREIGN PATENT DOCUMENTS

JP          08-273221       * 10/1996

* cited by examiner

*Primary Examiner*—Rodney G. McDonald
(74) *Attorney, Agent, or Firm*—Wood, Herron & Evans, L.L.P.

(57) ABSTRACT

The present invention presents an adaptable processing element for use in a processing system having multiple configurations. The processing element comprises a primary component and at least one detachable component, wherein the at least one detachable component can be retained for one configuration and removed for another configuration. For example, the detachable component may include a punch-out or knock-out located on a right-hand side and a left-hand side of a processing element in order to permit access of a gas supply line to a processing chamber for either a right-hand orientation or a left-hand orientation, respectively. Additionally, for example, the detachable component, whether retained or removed, can permit flexible use with different size processing chambers.

19 Claims, 19 Drawing Sheets

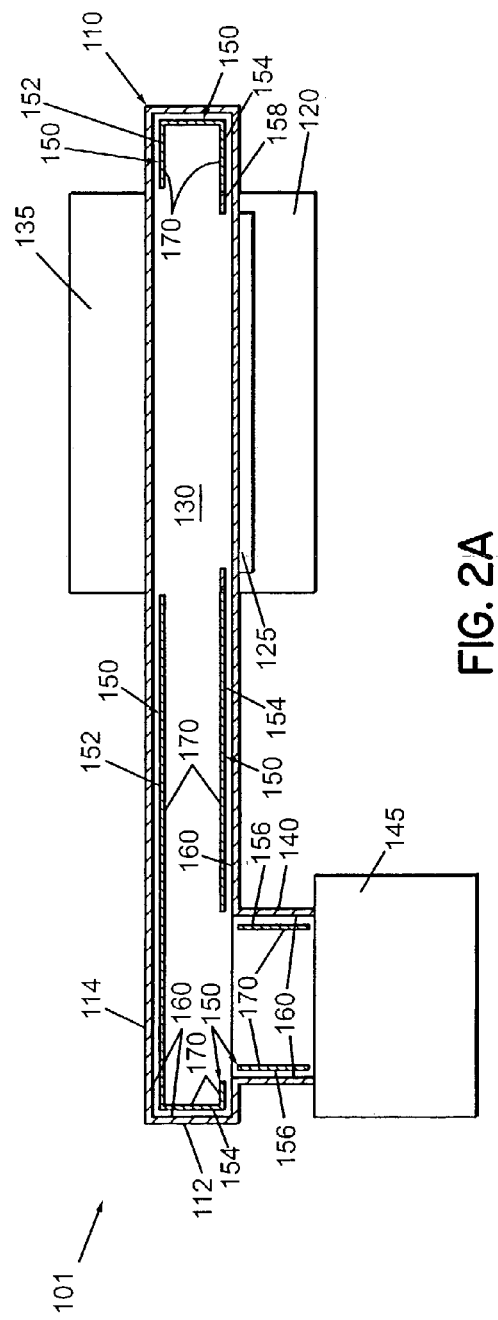
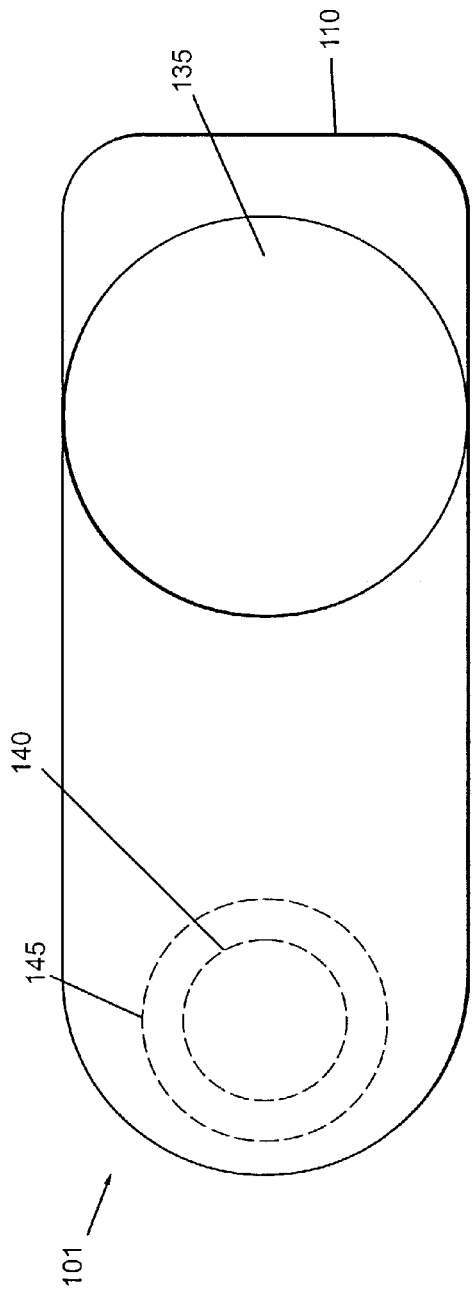
FIG. 2A
FIG. 2B

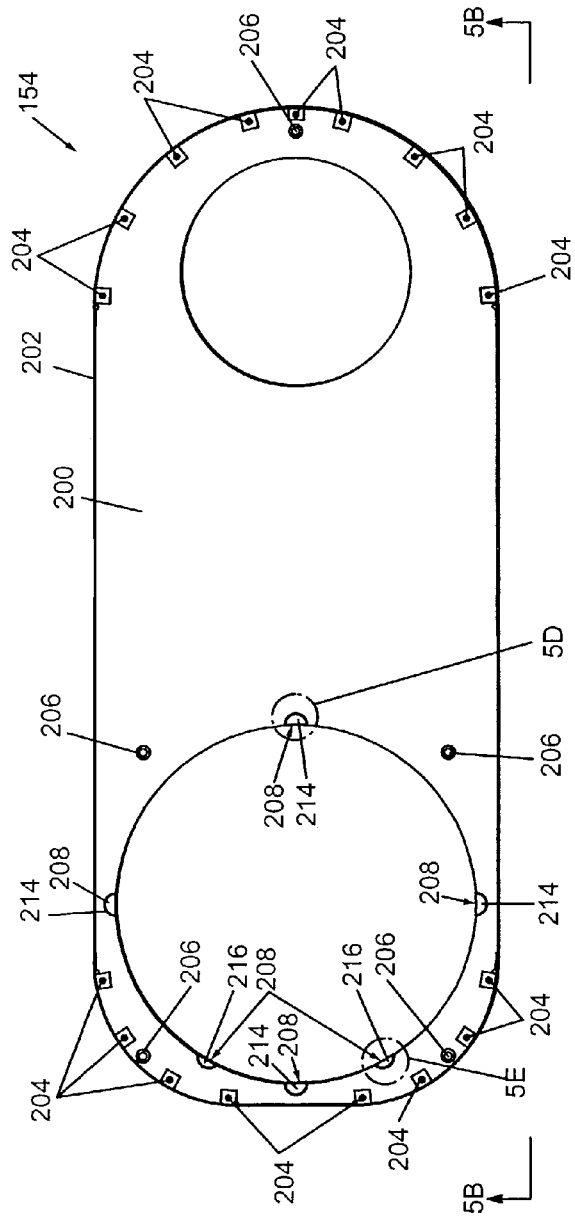
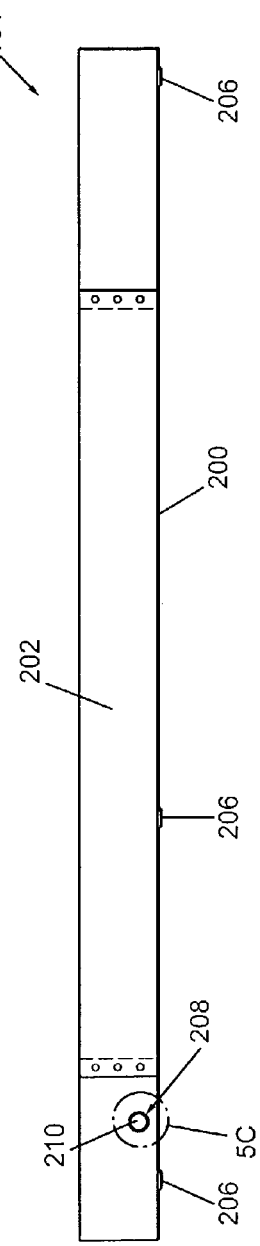
FIG. 5A
FIG. 5B

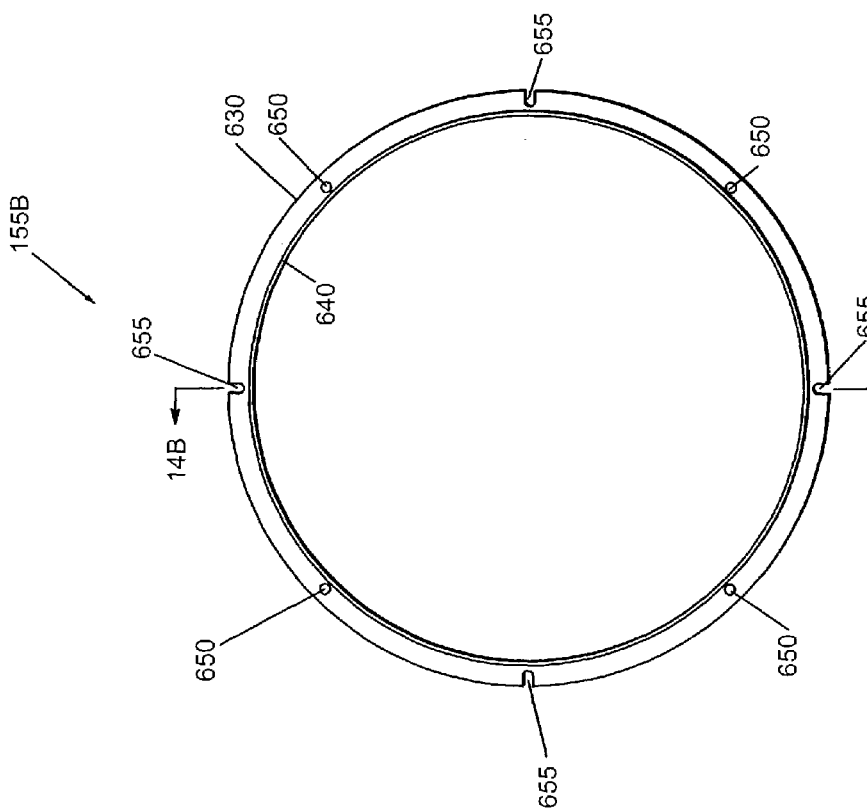

ADAPTABLE PROCESSING ELEMENT FOR A PROCESSING SYSTEM AND A METHOD OF MAKING THE SAME

This application is related to U.S. patent application Ser. No. 10/454,381, now abandoned, entitled "Method of surface treating a processing element in a processing system", filed on even date herewith; and U.S. patent application Ser. No. 10/454,798, now abandoned, entitled "Method of fabricating a shield", filed on even date herewith. The entire contents of these applications are herein incorporated by reference in their entirety."

FIELD OF THE INVENTION

The present invention relates to processing elements for vacuum processing machines, such as semiconductor wafer processing machines, and particularly processing elements such as protective chamber shields that protect the inside surfaces of the processing chambers of such machines from deposits during processing. The invention more particularly relates to the surface treating of such processing elements for improved film adhesion during processing.

BACKGROUND OF THE INVENTION

The fabrication of integrated circuits (ICs) in the semiconductor industry typically employs plasma to create and assist surface chemistry within a plasma reactor necessary to remove material from and deposit material onto a substrate. For example, plasma can be utilized with physical vapor deposition (PVD) to sputter material from a target and deposit the sputtered adatom onto the substrate, with chemical vapor deposition (CVD) to create chemical constituents suitable for deposition upon a substrate, or with dry plasma etching to create chemical constituents suitable for the removal of specific materials from the surface of a substrate.

In general, during plasma processing such as in the aforementioned processes, excess sputtered adatom in PVD systems, excess deposition chemistry in CVD systems, or excess etch chemistry and/or etch residue in etch systems can deposit on process system surfaces and accumulate from process-to-process. Therefore, such systems are commonly equipped with protective elements or liners that protect the underlying surfaces of more expensive processing components, and that can be replaced periodically with deposit-free, cleaned, refurbished, or new protective elements. Typically, the frequency for element replacement is governed by the type of process, and the nature of the material or film that accumulates on the exposed surfaces of the protective elements. Hence, it is additionally imperative to provide surfaces in contact with the processing environment that facilitate the adhesion of excess materials, and, in time, reduce contamination of future processes (i.e. particles, etc.) and potentially provide longer cycles between replacement of the protective elements.

Further, it is not uncommon to encounter an evolution of processing system configuration (i.e. change in size of processing chamber, pumping system, etc.) during the lifetime of a processing system. Typically, the continual evolution of a processing system as a manufacturing product has required an inventory of protective elements, each element or set of elements specific to a particular configuration. Hence, it is also imperative to provide low cost, replaceable protective elements that possess sufficient flexibility for use in a processing system having multiple configurations.

SUMMARY OF THE INVENTION

An objective of the present invention is to provide low cost elements, and low cost methods of manufacturing elements, used to protect the internal surfaces of vacuum processing chambers used in semiconductor wafer processing. Particular objectives are to provide chamber shields, and methods of manufacturing chamber shields that protect the surfaces of processing chambers and components of the machines in such chambers from deposition during processing. A more particular objective of the invention is to provide such elements in configurations that will fit a variety of different machine configurations and applications so that different size or shaped elements need not be manufactured and inventoried for each such machine configuration or application.

The present invention provides an adaptable processing element for use in a processing system and method of making the same.

In particular, the present invention provides a processing element, particularly embodied in chamber shields and chamber shield assemblies, for use in a processing system having two or more different configurations or applications. Such elements include a primary component; and a detachable component coupled to the primary component, wherein the processing element is configured for use in a first configuration of the processing system when the detachable component is retained with the primary component and the processing element is configured for use in a second configuration of the processing system when the detachable component is removed. In the illustrated embodiments, chamber shields are provided having components that are removable from their components so as to adapt the shields to machines of different configurations.

Additionally, a process kit is provided for use in a processing system. The kit is useful for a processing system that includes a processing chamber having an upper chamber portion and a lower chamber portion, a target assembly coupled to the processing chamber, a substrate holder for supporting a substrate coupled to the processing chamber, a pumping system, and a pumping duct coupling the pumping system to the processing chamber. The process kit, in the illustrated embodiments, includes a door shield coupled to the upper chamber portion of the processing chamber and configured with a detachable ring. The detachable ring is retained to facilitate use of the door shield with a first target assembly configuration and removed to facilitate use of the door shield with a second target assembly configuration. Similarly, a pod shield is provided that can be coupled to the lower chamber portion of the processing chamber and configured with a first detachable gas injection punch-out coupled to a right-hand side of the pod shield and a second detachable gas injection punch-out coupled to the left-hand side of the pod shield. The first detachable gas injection punch-out is removed to facilitate use of the pod shield with a right-hand orientation of the processing system and the second detachable gas injection punch-out is removed to facilitate use of the pod shield with a left-hand side orientation of the processing system. Alternatively, neither punchout is removed where no gas inlet ring is present in the machine. A pumping duct shield is similarly provided coupled to the pumping duct and configured with a detachable shield extension. The detachable shield extension is retained to facilitate use of the pumping duct shield with a first size of the pumping duct and retained to facilitate use of the pumping duct shield with a second size of the pumping duct.

Additionally, a method of producing a processing element for use in a processing system is provided. The method comprises fabricating the processing elements described above by configuring sheet metal shields with stamped or laser cut perforations, or other types of weakened members, to facilitate the removal of the removable components from the primary components.

Additionally, a method of using a processing element in a processing system having two or more configurations as described above is provided. The method comprises providing the elements as described above and using the elements by retaining the removable elements for use with some configurations of processing systems and removing the removable elements for use with other configurations of processing systems. The method includes determining whether the processing element is for use in a first configuration of the processing system and whether the processing element is for use in a second configuration of the processing system; retaining the detachable component to facilitate use of the processing element with the first configuration of the processing system; and removing the detachable component to facilitate use of the processing element with the second configuration of the processing system.

The present invention is particularly suited for use in processing equipment of the type described in U.S. Pat. Nos. 4,909,695; 4,915,564 and 5,516,732, and U.S. patent application Ser. No. 09/725,823, each hereby expressly incorporated herein by reference. Machines of this type are marketed under the trademarks ECLIPSE, ECLIPSE MARK II, ECLIPSE STAR and ECLIPSE MARK IV by Applicant's assignee, Tokyo Electron Limited. Details of structure within chambers of such machines are also described in U.S. Pat. Nos. 5,820,329; 6,143,147 and 6,258,228, each also hereby expressly incorporated herein by reference.

For purposes of this application, the target side of a chamber of a deposition system is referred to as the upper portion while the substrate side is referred to as the lower portion, regardless of which way the chamber is oriented in the processing machine. For example, in the Eclipse-type equipment referred to above, the target and substrate lie in parallel vertical planes and are aligned to face each other on a horizontally oriented axis.

These and other objectives and advantages of the present invention will be more readily apparent from the detailed description of the drawings in which:

BRIEF DESCRIPTION OF THE DRAWINGS

FIG. 2A shows a schematic side view of a processing system according to another embodiment of the present invention;

FIG. 2B shows a schematic top view of the processing system illustrated in FIG. 2A;

FIG. 5A presents a top view of a pod shield according to an embodiment of the present invention;

FIG. 5B presents a side view of a pod shield according to an embodiment of the present invention;

FIG. 14A presents a top view of a ring shield according to an embodiment of the present invention; and FIG. 14B presents a cross-sectional view of the ring shield depicted in FIG. 13A.

DETAILED DESCRIPTION

Figure 1:
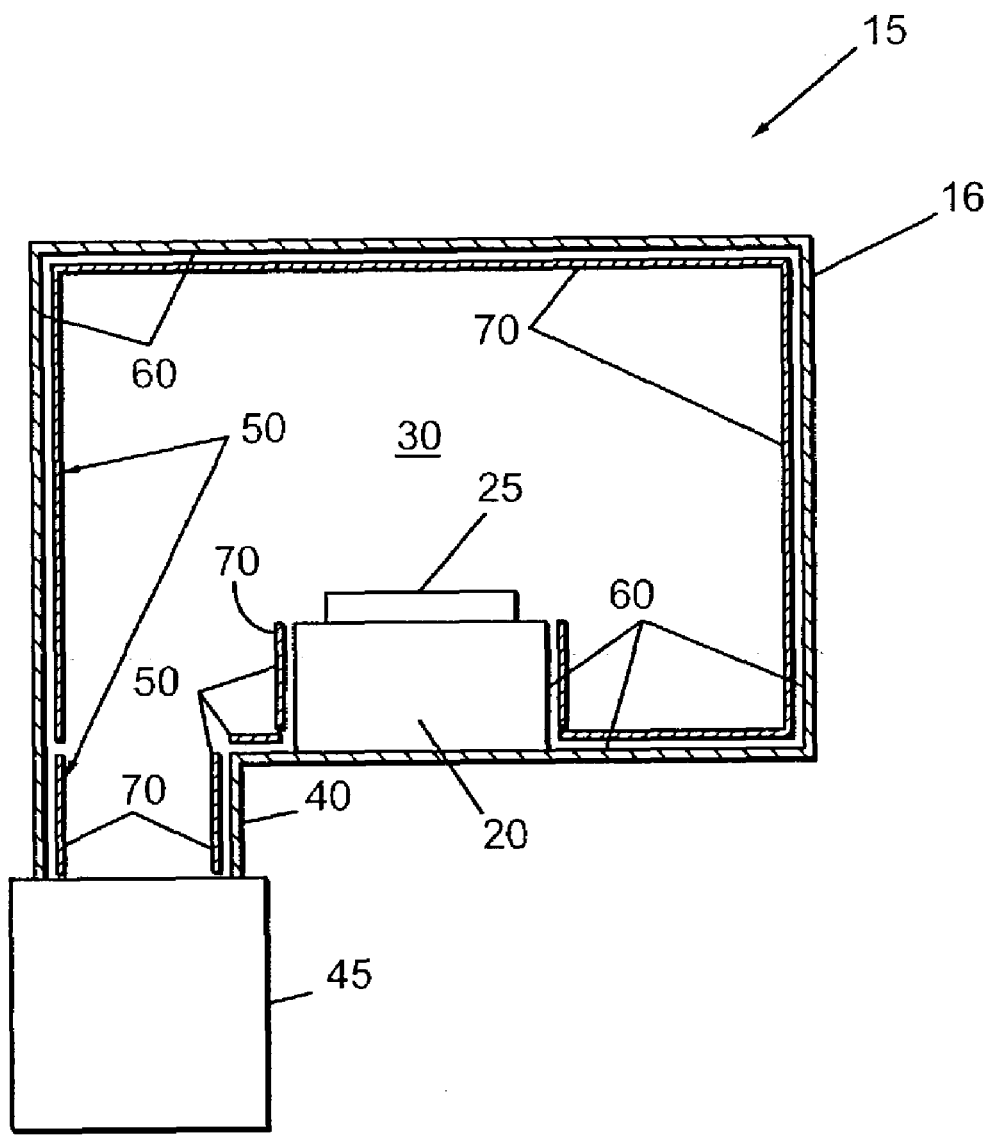
FIG. 1 shows a simplified diagram of a processing system according to an embodiment of the present invention.

According to an embodiment of the present invention, a processing system 15 is depicted in FIG. 1 comprising a processing chamber 16, a substrate holder 20 for supporting a substrate 25, and a pumping duct 40 coupled to a pumping system 45 for altering the pressure of a processing region 30 in processing chamber 16. For example, processing chamber 16 can facilitate processing substrate 25 at elevated pressure, atmospheric pressure, or reduced (vacuum) pressure. Moreover, for example, processing chamber 16 can facilitate the formation of a processing plasma in the processing region 30 adjacent substrate 25. The processing system 15 can be configured to process various substrates (i.e. 100 mm, 200 mm substrates, 300 mm substrates, or larger).

Desirably, processing system 15 comprises a deposition system such as a physical vapor deposition (PVD) system. In another embodiment, processing system 15 comprises a chemical vapor deposition (CVD) system. In yet another embodiment, processing system 15 comprises a plasma-enhanced chemical vapor deposition (PECVD) system. Alternately, processing system 15 comprises an etch system.

Referring again to FIG. 1, processing system 15 further comprises one or more processing elements 50 coupled to the processing chamber 16, and configured to protect one or more valuable surfaces 60 of the processing chamber 16. Additionally, the one or more processing elements 50 comprise one or more exposed surfaces 70 that are exposed to or in contact with the processing environment in processing region 30. The one or more processing elements 50 can, for example, constitute a process kit that can be periodically replaced wholly, or part-by-part. The one or more processing elements 50 can be fabricated from a variety of materials including metals such as aluminum, stainless steel, etc., and non-metals such as ceramics (e.g. alumina, quartz, silicon carbide, etc.). Thereafter, the one or more exposed surfaces 70 on the one or more processing elements 50 are treated to increase the surface roughness in order to improve the adhesion of materials during processing. In one embodiment, the one or more exposed surfaces 70 are roughened using a belt sander to, for example, an average roughness in excess of Ra=250 mil (or 6.3 micron). The belt sanding can be carried out before the spinning of the sheet metal to form the shields, for example, by forming grooves therein in at least two directions such that said grooves form an intersecting pattern.

The use of belt sanding to roughen a surface for improved adhesion has resulted in a significant reduction in fabrication cost (greater than 50% reduction), as opposed to conventionally used techniques such as grit blasting, etc. For example, prior to assembly, sheet metal can be drawn through a belt sander for a first pass, then rotated 90 degrees and drawn through the belt sander for a second pass. In doing so, a cross-hatched pattern can be formed. The belt sander can, for example, comprise a 36 grit (silicon carbide) abrasive surface. Alternatively, the belt sander can, for example, comprise a 40 grit, 50-60 grit, or 80-100 grit abrasive surface. Making the processing elements 50 out of sheet metal allows belt sanding to be used and the belt sanding process to be applied when the sheet metal is flat, before it is formed into the shapes needed for the shields. With prior machined shields, more expensive roughening processes had to be used.

According to another embodiment of the present invention, FIGS. 2A and 2B present a side view and a top view, respectively, of a physical vapor deposition (PVD) processing system 101 comprising a processing chamber 110, a substrate holder 120 for supporting a substrate 125, a sputter target assembly 135, and a pumping duct 140 coupled to a pumping system 145 for altering the pressure of a processing region 130 in processing chamber 110. For example, processing chamber 110 can facilitate processing substrate 125 at reduced (vacuum) pressure. Moreover, processing chamber 110 can facilitate the formation of a processing plasma in the processing region 130 adjacent substrate 125 and sputter target assembly 135. The processing plasma can be formed of a chemically inert species such as a Noble gas (e.g. Argon) that is configured to interact with the sputter target and through physical ion bombardment of the sputter target introduce sputtered adatom to the processing region 130 for deposition onto substrate 125. For example, the sputter target assembly can comprise a copper target to which electrical bias (direct current, DC; alternating current, AC, or RF) is applied. The sputter target assembly 135 may or may not further comprise a magnet system.

Referring still to FIGS. 2A and 2B, processing system 101 further comprises one or more processing elements 150 coupled to the processing chamber 110, and configured to protect one or more valuable surfaces 160 of the processing chamber 110. Additionally, the one or more processing elements 150 comprise one or more exposed surfaces 170 that are exposed to or in contact with the processing environment in processing region 130. The one or more processing elements 150 can, for example, constitute a process kit that can be periodically replaced wholly, or part-by-part.

Figure 3A:
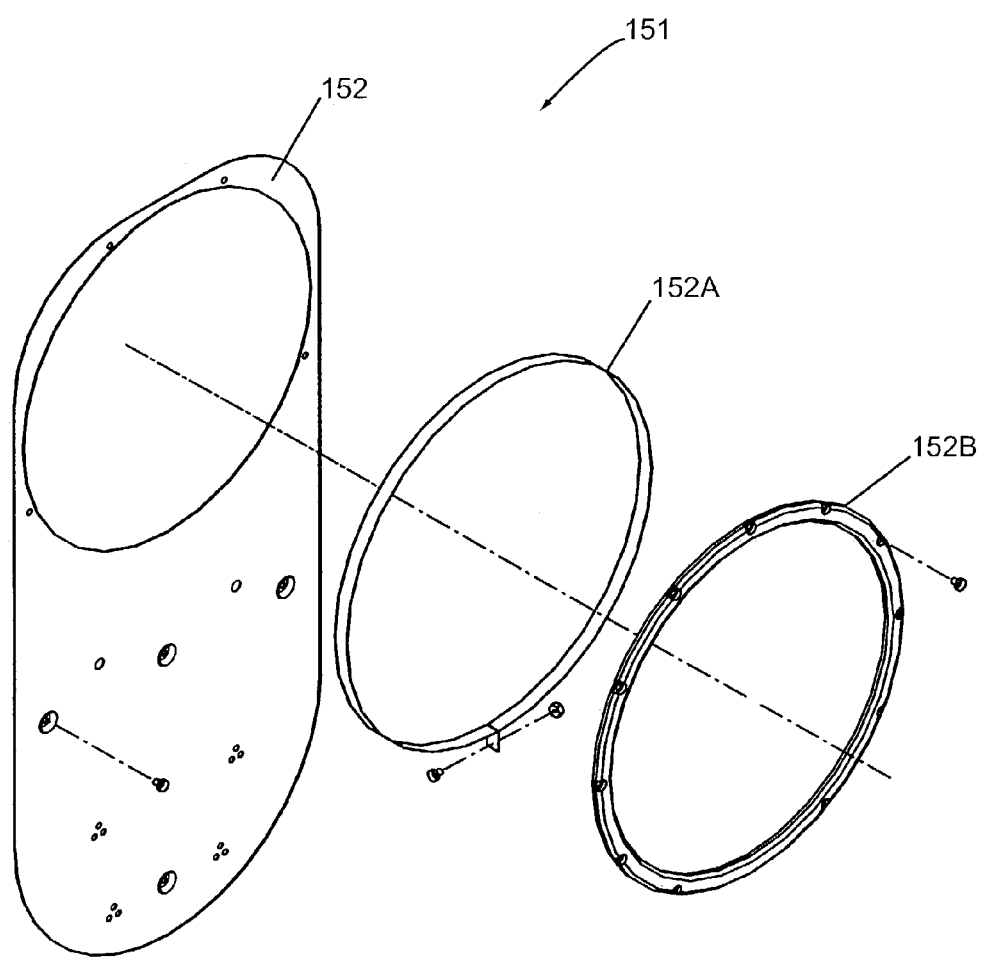
FIG. 3A presents an assembly view of a process kit coupled to an upper chamber portion of the processing system presented in FIGS. 2A, and 2B.
Figure 3B:
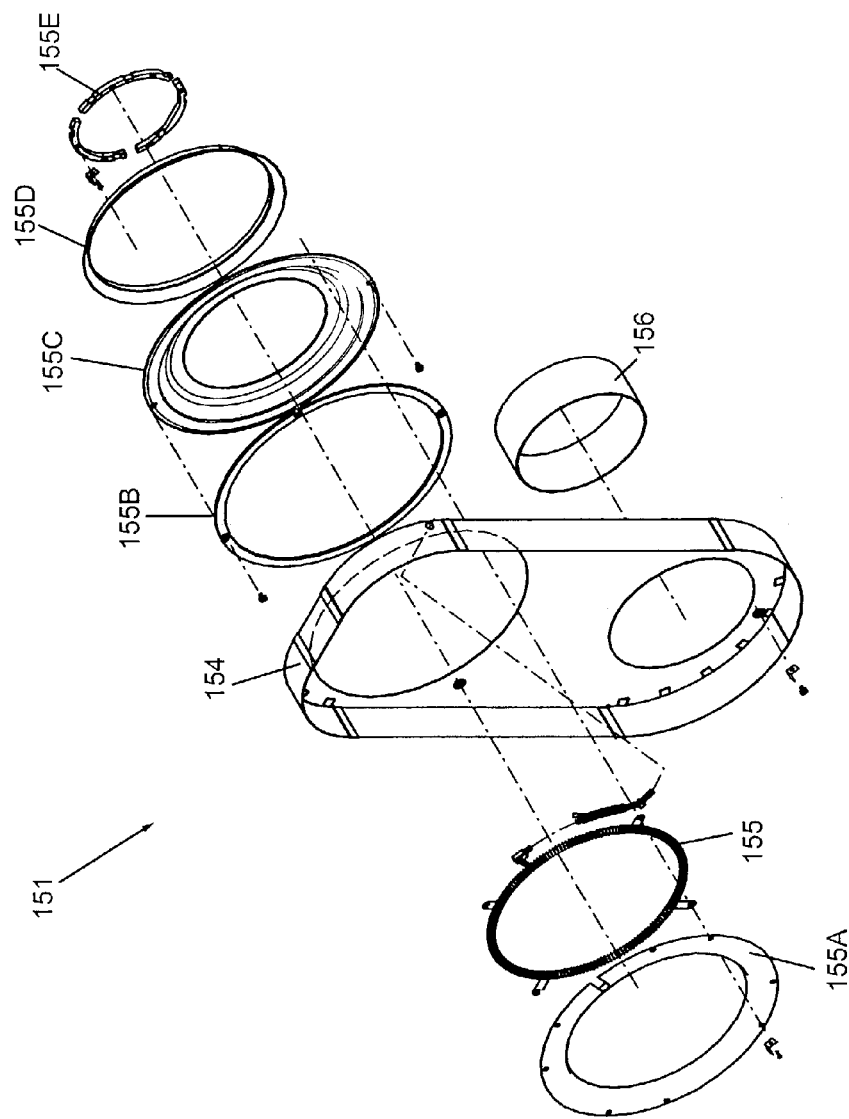
FIG. 3B presents an additional assembly view of a process kit coupled to a lower chamber portion of the processing system presented in FIGS. 2A and 2B.

For example, processing chamber 110 can comprise a lower chamber portion 112 (or pod), and an upper chamber portion 114 (or pod door). The upper chamber portion 114 can be coupled to the lower chamber portion 112 using, for example, a hinge (not shown), and, therefore, it can serve as a chamber door for opening the processing chamber 110 and accessing its interior. FIGS. 3A and 3B illustrate processing elements in the form of chamber shield assemblies of a type configured for a processing apparatus of the type described in U.S. Pat. No. 4,915,564. Prior art and other shields for this apparatus are described in detail in U.S. patent application Ser. No. 10/349,661, filed Jan. 23, 2003, hereby expressly incorporated herein by reference. As shown in FIG. 3A, a process kit 151 can comprise processing elements coupled to the upper chamber portion 114, wherein the process kit 151 comprises a door shield 152, an adaptor shield 152A, and a dark space shield 152B. The dark space shield 152A and adapter shield 152B are configured to fit a sputtering cathode adapter that supports the cathode assembly in a pod door. Configurations of such adapters and shields are discussed in detail in U.S. patent application Ser. No. 10/438,304, hereby expressly incorporated herein by reference. Moreover, with reference now to FIG. 3B, the process kit 151 can further comprise processing elements coupled to the lower chamber portion 112, wherein the process kit 151 comprises a pod shield 154, an optional gas injection ring 155, a gas ring shield 155A, a ring shield 155B, a substrate holder shield 155C, a plenum shield 155D, an (optional) heater shield 155E, and a pumping duct shield 156. Each of the processing elements listed above are replaceable and serve to protect valuable surfaces 160 of processing chamber 110.

Figure 4A:
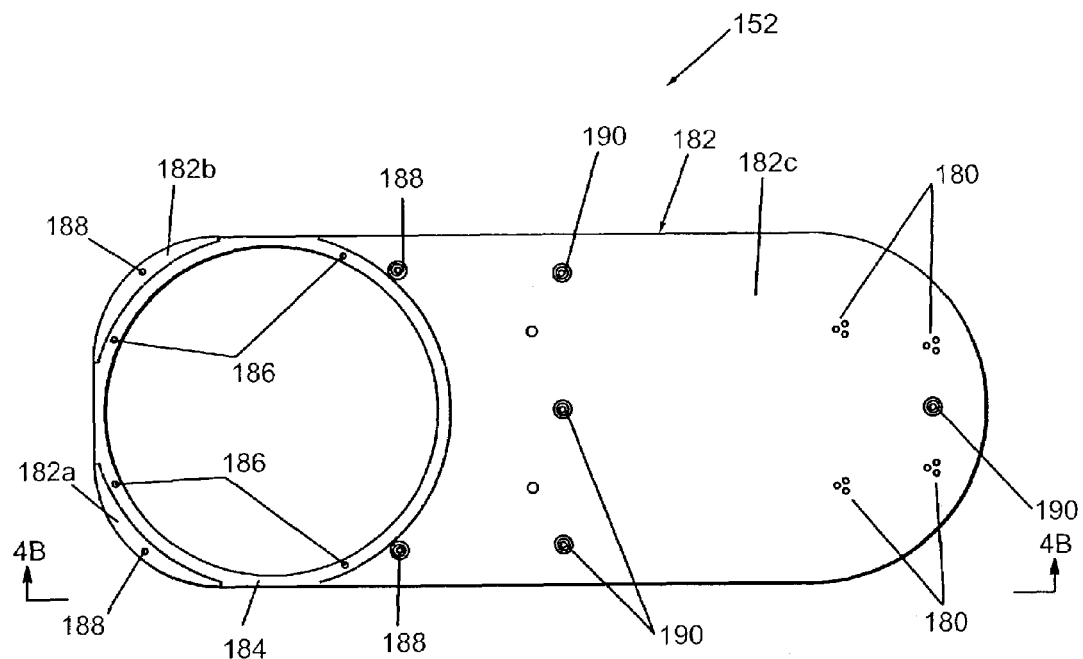
FIG. 4A presents a top view of a door shield according to an embodiment of the present invention.
Figure 4B:
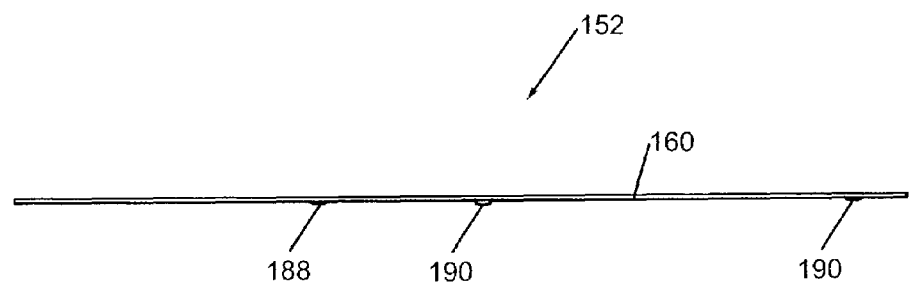
FIG. 4B presents a side view of a door shield according to an embodiment of the present invention.

FIGS. 4A and 4B present a top view and a side view, respectively, of the door shield 152 that is coupled to the upper chamber portion 114. The door shield 152 can comprise one or more access features 180 in order to permit the access of measurement instrumentation, such as pressure sensing devices, to the processing region 130 within processing chamber 110. For example, each access feature can comprise a cluster of three through-holes, wherein the measurement device can be positioned behind the center of the cluster and, therefore, prevent excessive deposition of process materials on the measurement device.

Additionally, the door shield 152 can be fabricated to accommodate different sizes for the target housed within target assembly 135. As depicted in FIG. 4A, door shield 152 comprises a primary component 182 that is suitable for a first target size, and a detachable component 184 that is suitable for a second size. The primary component 182 is part of the same metal sheet of which the detachable component 184 is part. Primary component 182 includes separate pieces 182a, 182b and 182c, when the detachable component 184 is removed. However, the separate pieces 182a, 182b and 182c retain their spacial relationship when installed in the chamber because each is separately secured to structure of the chamber. When the detachable component 184 is removed, the primary component 182 (herein referring collectively to the three pieces 182a, 182b and 182c) can be coupled to the upper chamber portion 114 to accommodate a twelve (12) inch diameter target, and, when the detachable component 184 is not removed, the primary component 182 with the detachable component 184 can be coupled to the upper chamber portion 114 to accommodate a ten (10) inch diameter target. The door shield 152 further comprises a first set of mounting features 186 utilized for the first target size for coupling the door shield 152 to the upper chamber portion 114, a second set of mounting features 188 utilized for the second target size for coupling the door shield 152 to the upper chamber portion 114, and a third set of mounting features 190 common to all of the target sizes for coupling the door shield 152 to the upper chamber portion 114. Each mounting feature 186, 188, and 190 can, for example, permit the passage of a fastener, such as a bolt, for fastening the door shield 152 to the processing chamber 110 upon receipt of the fastener in a tapped feature.

Figure 4C:
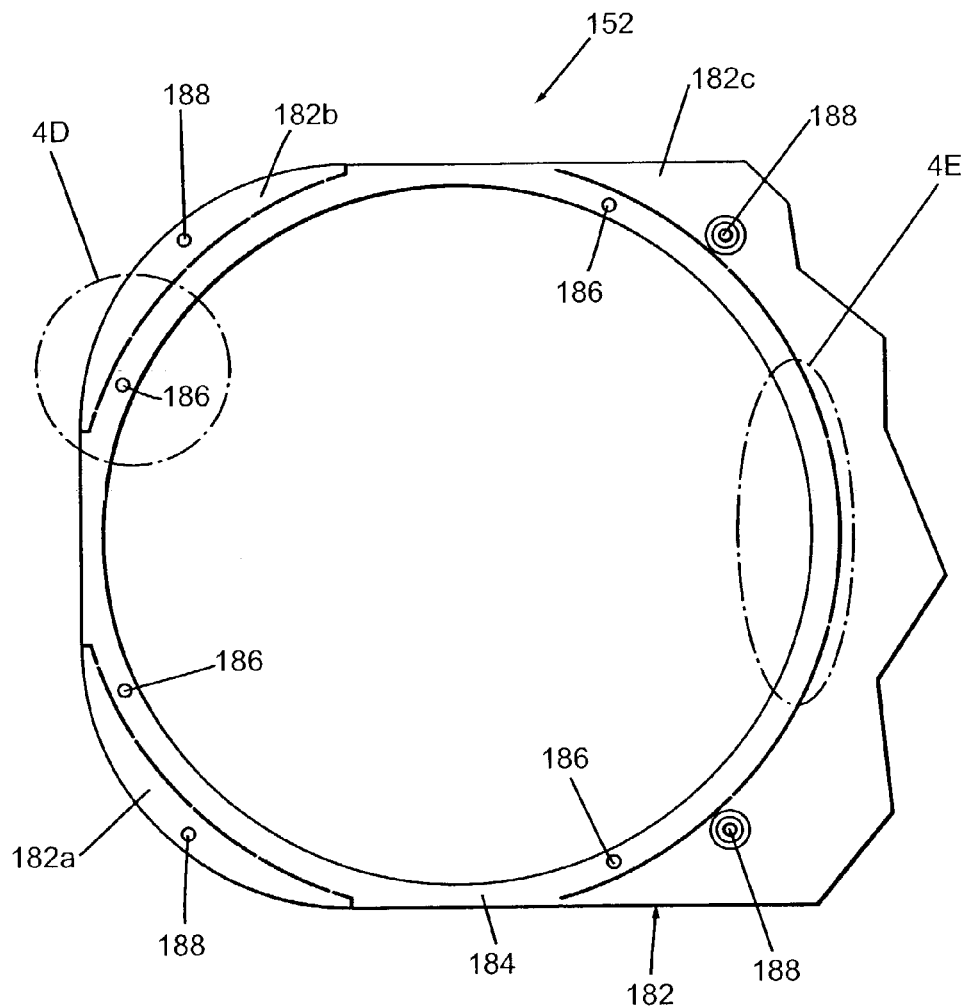
FIG. 4C presents an expanded top view of the door shield presented in FIG. 4A.
Figure 4D:
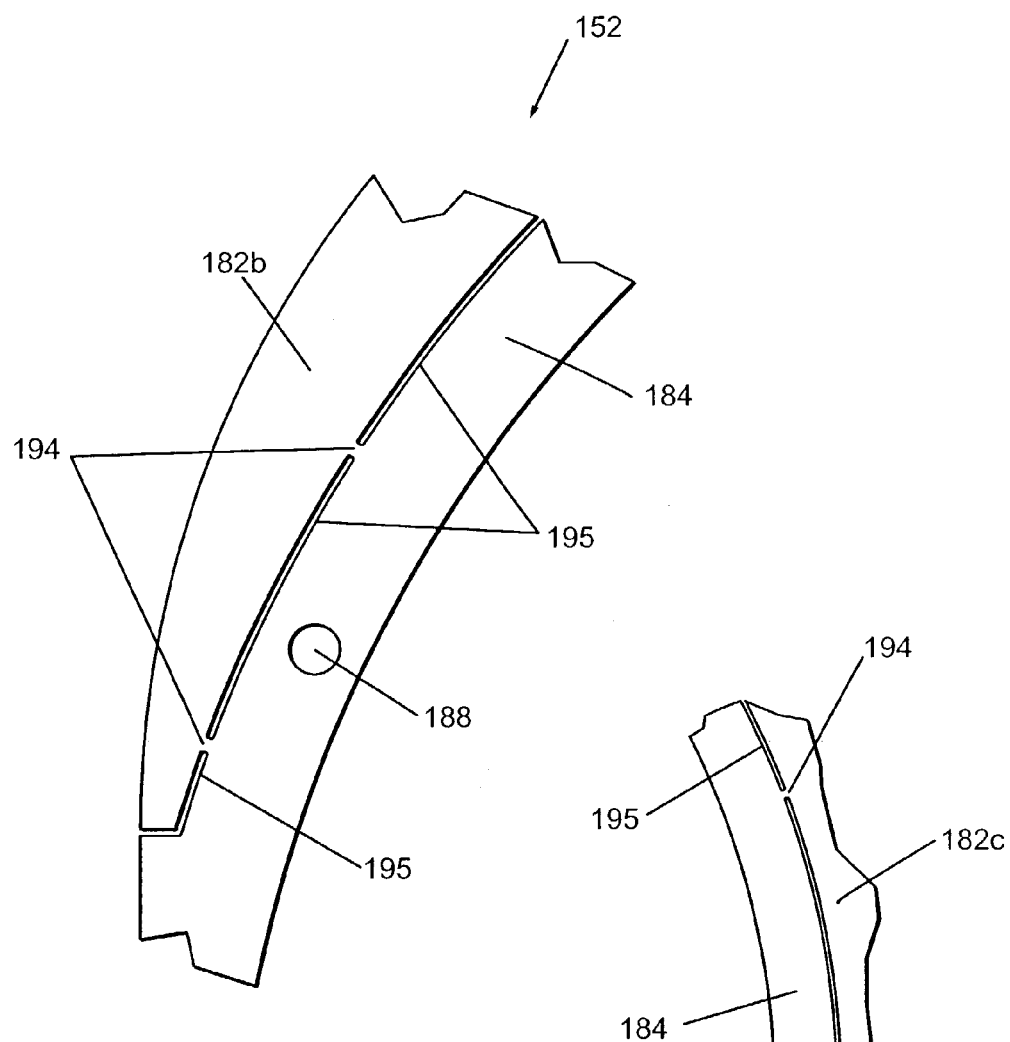
FIG. 4D presents another expanded top view of the door shield presented in FIG. 4A.
Figure 4E:
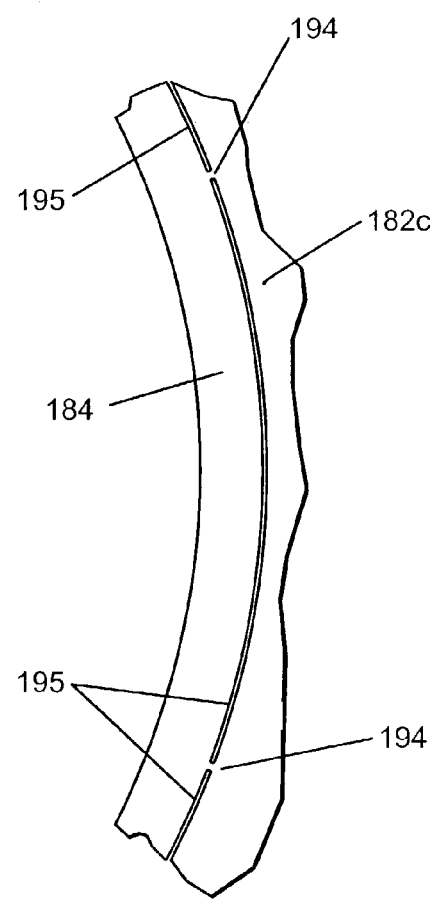
FIG. 4E presents another expanded top view of the door shield presented in FIG. 4A.

FIG. 4C presents an expanded view of the door shield 152 with the detachable component 184, and FIGS. 4D and 4E present expanded views of the coupling between the detachable component 184 and the primary component 182. As illustrated in FIGS. 4D and 4E, a narrow cut 195 can be made within the door shield 152 leaving one or more attachment features 194 and, thereby, delineate the primary component 182 and the detachable component 184, the detachable component 184 comprising a detachable ring. The narrow cut 195 can be achieved, for example, using a laser cutting system, and the width of the cut can, for example, be approximately 10 to 80 mil (e.g., 30 mil). Additionally, the one or more attachment features can, for example, be approximately 10 to 160 mil in length (e.g., 60 mil). The smallness of the remaining one or more attachment features 194 can permit simple decoupling of the detachable component 184 from the primary component 182 (e.g. manual flexing and snapping of the two pieces). Therefore, a single processing element can be fabricated, while providing the flexibility of use with different sized targets.

FIGS. 5A and 5B present a side view and a top view, respectively, of a pod shield 154 that is coupled to the lower chamber portion 112. The pod shield 154 can, for example, be fabricated from a floor portion 200 and a wall portion 202, wherein the floor portion 200 is coupled to the wall portion 202 using a plurality of attachment elements 204. For example, the attachment elements 204 can comprise tabs for welding the floor portion 200 to the wall portion 202. Furthermore, the pod shield 154 comprises a plurality of mounting features 206 for coupling the pod shield 154 to the lower chamber portion 112 of processing chamber 110. Each mounting feature 206 can, for example, permit the passage of a fastener, such as a bolt, for fastening the pod shield 154 to the processing chamber 110 upon receipt of the fastener in a tapped feature.

Figure 5C:
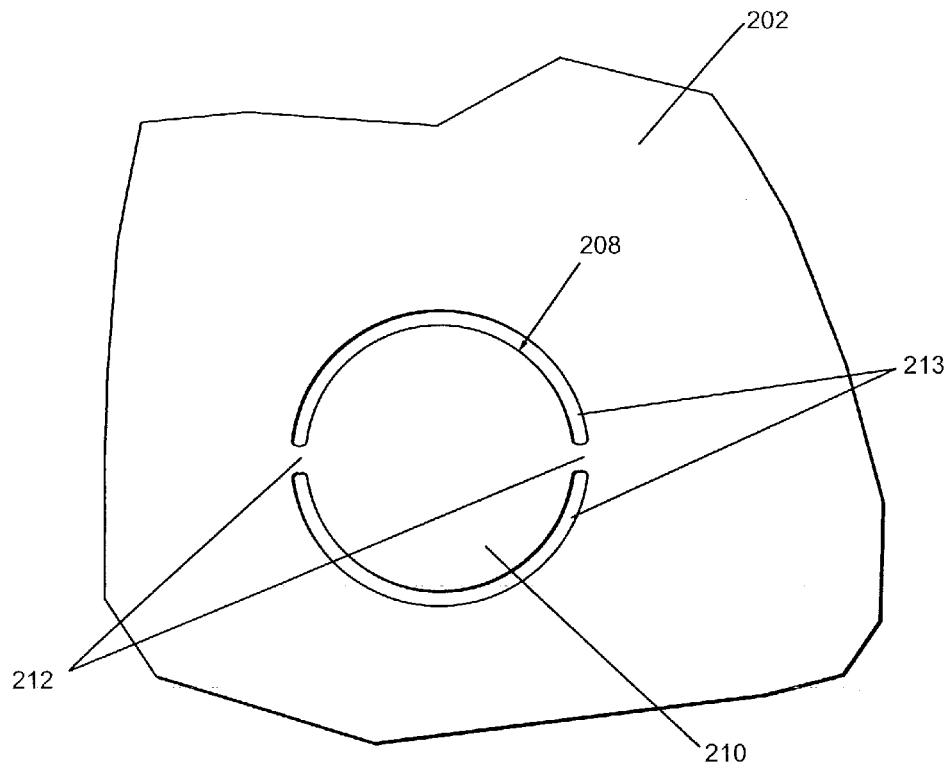
FIG. 5C presents an expanded top view of the pod shield presented in FIG. 5A.

Referring still to FIGS. 5A and 5B, the pod shield 154 further comprises one or more detachable components 208 coupled to a primary component comprising floor portion 200 and wall portion 202. For example, the one or more detachable components 208 can comprise detachable gas injection punch-outs 210 located on opposite sides of the pod shield 154. The detachable gas injection punch-outs can facilitate use of the pod shield 154 on either a right-hand system wherein the process gas(es) enter processing region 130 on the right-hand side of processing chamber 110, or a left-hand system wherein the process gas(es) enter processing region 130 on the left-hand side of the processing chamber 110. As illustrated in FIG. 5C, a narrow cut 213 can be made within the wall portion 202 of the second processing element 154 leaving one or more attachment features 212 and, thereby, delineate the primary component comprising wall portion 202 and floor portion 200, and the detachable gas injection punch-outs 210. The narrow cut 213 can be achieved, for example, using a laser cutting system, and the width of the cut can, for example, be approximately 10 to 80 mil (e.g., 30 mil). Additionally, the one or more attachment features can, for example, be approximately 10 to 160 mil in length (e.g., 60 mil). The smallness of the remaining one or more attachment features 212 can permit simple decoupling of the detachable gas injection punch-outs 210 from the primary component. Therefore, a single processing element can be fabricated, while providing the flexibility of use with different processing chamber orientations, i.e. gas injection orientations, if required.

Figures 5D, 5E:
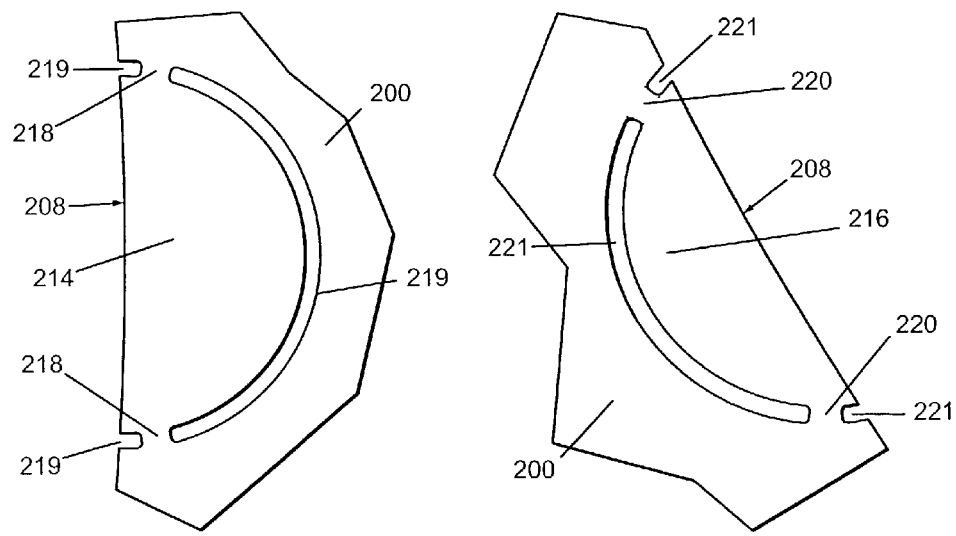
FIG. 5D presents another expanded top view of the pod shield presented in FIG. 5A.
FIG. 5E presents another expanded top view of the pod shield presented in FIG. 5A.
Figure 6B:
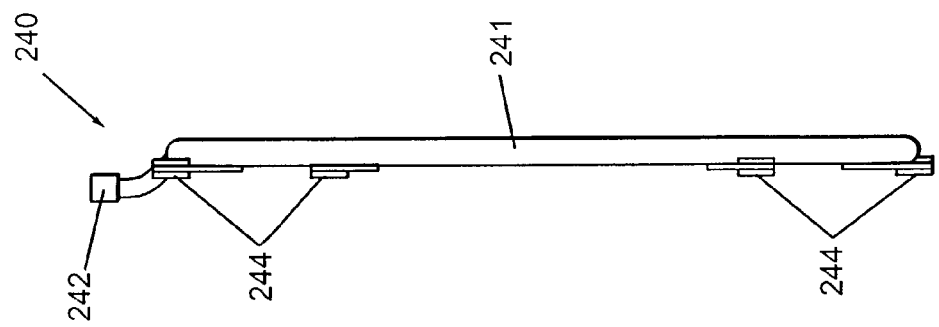
FIG. 6B presents a side view of a left-hand gas injection ring according to an embodiment of the present invention.
Figure 6A:
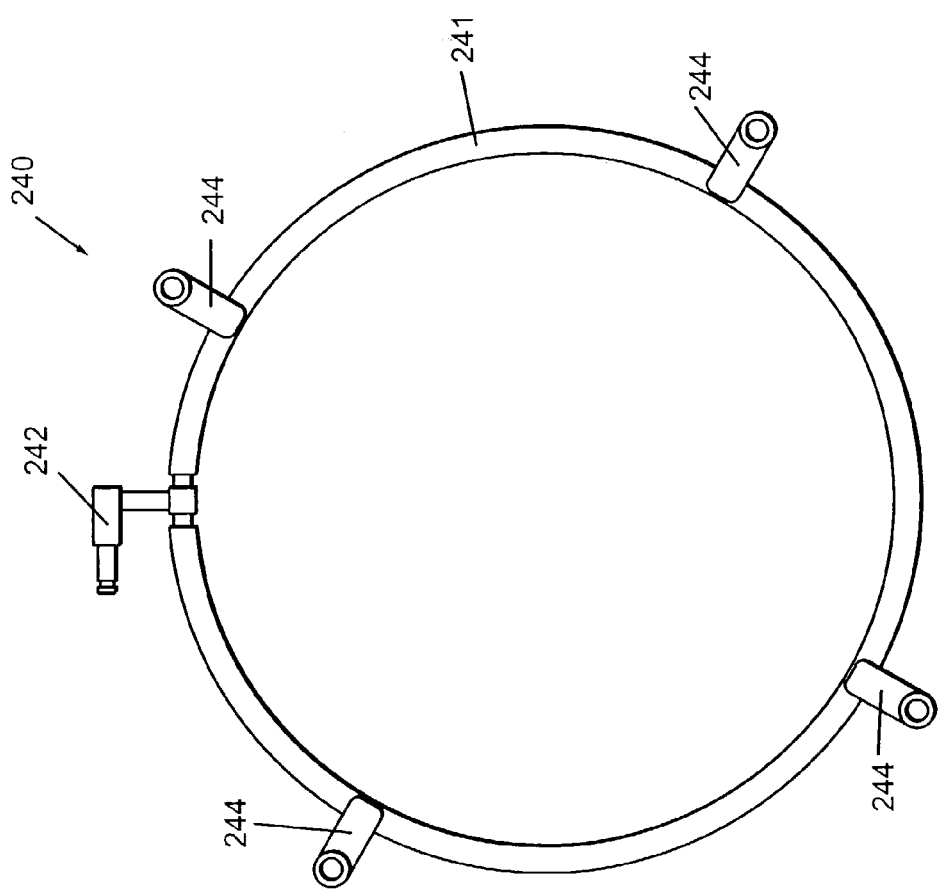
FIG. 6A presents a top view of a left-hand gas injection ring according to an embodiment of the present invention.
Figure 6D:
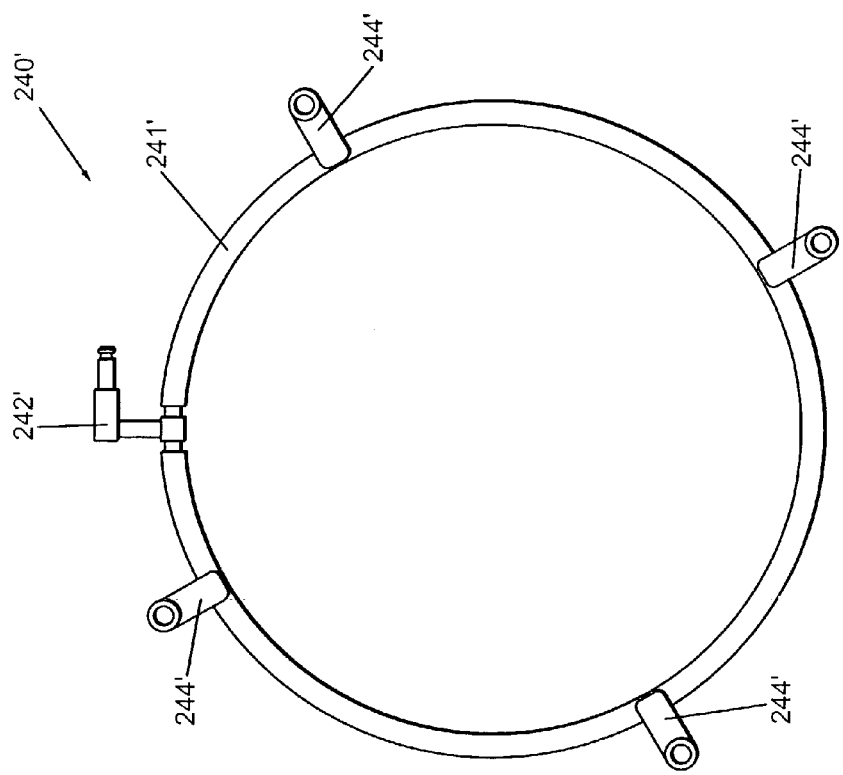
FIG. 6D presents a side view of a right-hand gas injection ring according to an embodiment of the present invention.
Figure 6C:
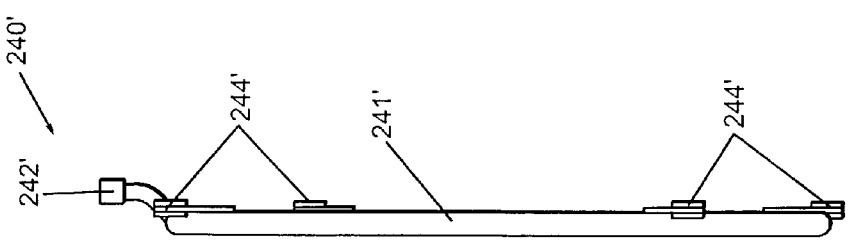
FIG. 6C presents a top view of a right-hand gas injection ring according to an embodiment of the present invention.

Additionally, for example, the one or more detachable components 208 can comprise detachable clearance punch-outs 214 and detachable gas inject line clearance punch-outs 216 to accommodate an optional gas injection ring 240 presented in FIGS. 6A,B (left-hand gas injection ring, top and side views, respectively) and 6C,D (right-hand gas injection ring, side and top views, respectively). For example, the optional gas injection ring 240 (240') comprises a distribution ring 241 (241'), a gas entry port 242 (242'), and a plurality of mounting structures 244 (244'). As illustrated in FIG. 5D, a narrow cut 219 can be made within floor portion 200 of the pod shield 154 leaving one or more attachment features 218 and, thereby, delineate the primary component comprising wall portion 202 and floor portion 200, and the detachable clearance punch-outs 214. The detachable clearance punch-outs, once removed, can provide clearance for the plurality of mounting structures 244 utilized to affix the gas injection ring 240, 240' to the substrate holder shield 155C. Moreover, as illustrated in FIG. 5E, a narrow cut 221 can be made within floor portion 200 of the pod shield 154 leaving one or more attachment features 220 and, thereby, delineate the primary component comprising wall portion 202 and floor portion 200, and the detachable gas inject line clearance punch-outs 216. The detachable gas inject line clearance punch-outs 216, once removed, can provide clearance for a flexible gas line (not shown) for coupling a gas supply (not shown) to the gas entry port 242, 242' of the gas injection ring 240, 240'. The narrow cut 219, 221 can be achieved, for example, using a laser cutting system, and the width of the cut can, for example, be approximately 10 to 80 mil (e.g., 30 mil). Additionally, the one or more attachment features can, for example, be approximately 10 to 160 mil in length (e.g., 60 mil). The smallness of the remaining one or more attachment features 218, 220 can permit simple decoupling of the detachable clearance punch-outs 214 and detachable gas inject line clearance punch-outs 216 from the primary component. Therefore, a single processing element can be fabricated, while providing the flexibility of use with different optional gas injection ring orientations.

Figure 7A:
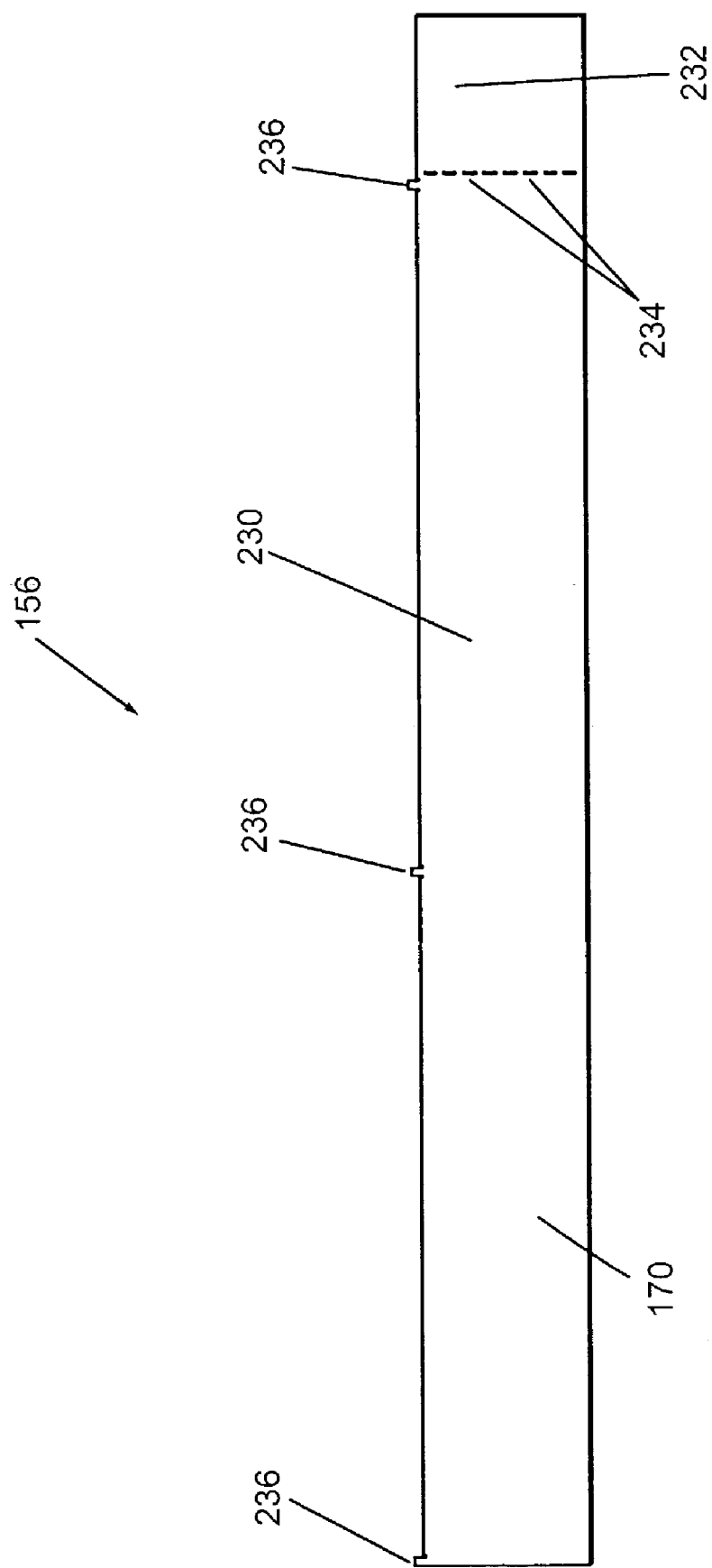
FIG. 7A presents a side view of a pumping duct shield according to an embodiment of the present invention.
Figures 7B, 7C:
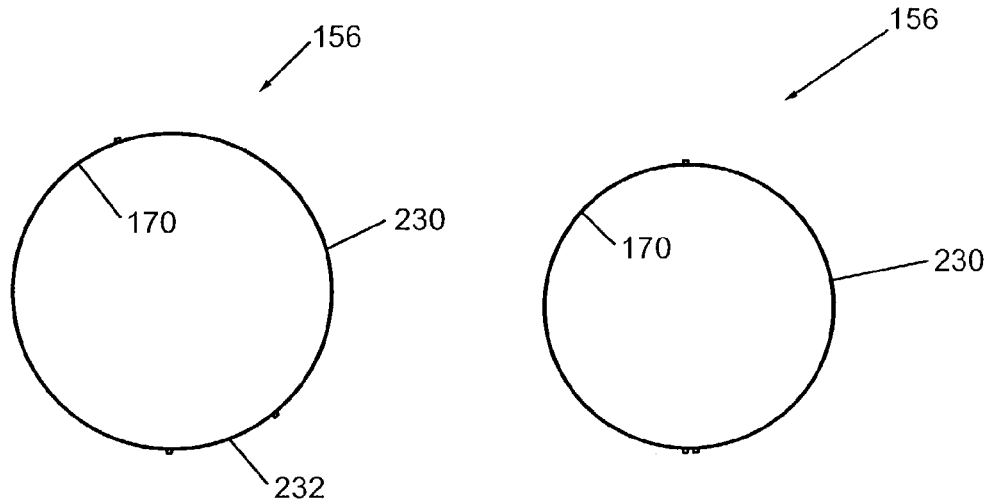
FIG. 7B presents a top view of a pumping duct shield according to an embodiment of the present invention.
FIG. 7C presents a top view of a pumping duct shield according to another embodiment of the present invention.

FIG. 7A presents a side view of a pumping duct shield 156 that is coupled to the pumping duct 140 of processing system 110. The pumping duct shield 156 comprises a primary component 230 and a detachable component 232 coupled thereto. For example, the pumping duct shield 156, as depicted in FIG. 7A, can be fitted within two different pumping ducts of different size (i.e. different diameter pumping duct). FIG. 7B illustrates a configuration for a first size of a pumping duct, wherein the detachable component 232 has not been removed. FIG. 7C illustrates a configuration for a second size of a pumping duct, wherein the detachable component 232 has been removed. Additionally, the pumping duct shield 156 can, optionally, comprise one or more tabs 236 that, once the pumping duct shield 156 is fitted within the pumping duct 140, each tab can be bent radially outward to retain the pumping duct shield 156 in the pumping duct 140. As illustrated in FIG. 7A, a narrow cut can be made within the pumping duct shield 156 leaving one or more attachment features 234 and, thereby, delineate the primary component 230 from the detachable component 232, the detachable component 232 comprising a detachable shield extension. The narrow cut can be achieved, for example, using a laser cutting system, and the width of the cut can, for example, be approximately 10 to 80 mil (e.g., 30 mil). Additionally, the one or more attachment features can, for example, be approximately 10 to 160 mil in length (e.g., 60 mil). The smallness of the remaining one or more attachment features 234 can permit simple decoupling of the detachable component from the primary component. Therefore, a single processing element can be fabricated, while providing the flexibility of use with different sizes of the pumping duct.

Figure 8:
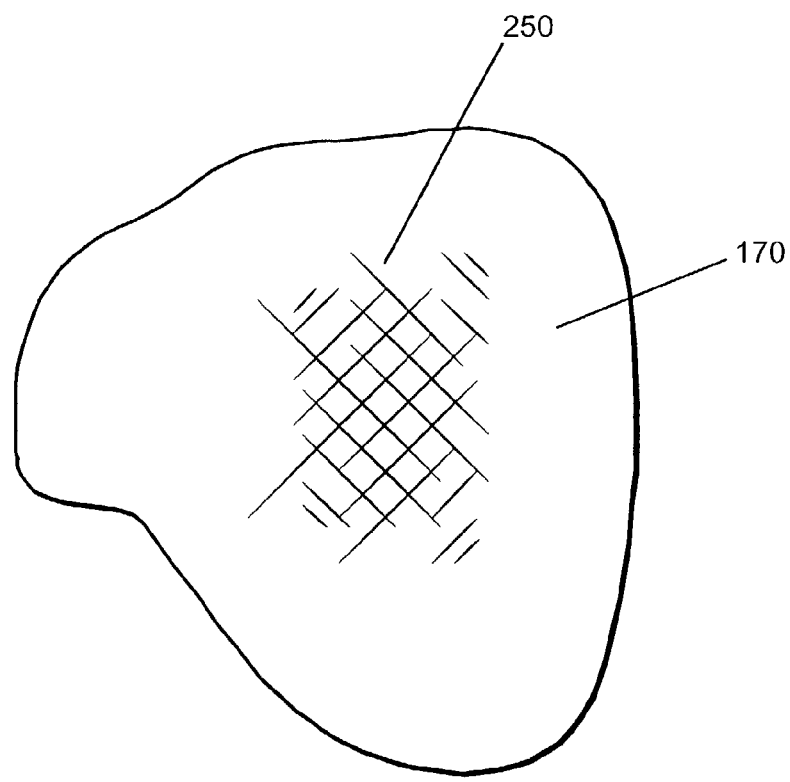
FIG. 8 illustrates a surface treatment pattern on a processing element according to an embodiment of the present invention.

The one or more processing elements 152, 154, and 156 can be fabricated from a variety of materials including metals such as aluminum, etc. As described above, the one or more exposed surfaces 170 on the one or more processing elements 150, such as 152, 154, 156, are treated to increase the surface roughness in order to improve the adhesion of materials. In one embodiment, the one or more exposed surfaces 170 are roughened using a belt sander to, for example, a roughness in excess of Ra=250 mil (or 6.3 micron). Additionally, for example, the roughening treatment of the one or more exposed surfaces can be applied to form a cross-hatching pattern 250 as shown in FIG. 8. For example, prior to assembly, sheet metal can be drawn through a belt sander for a first pass, then rotated 90 degrees and drawn through the belt sander for a second pass. In doing so, a cross-hatched pattern can be formed. The belt sander can, for example, comprise a 36 grit (silicon carbide) abrasive surface. Alternatively, the belt sander can, for example, comprise a 40 grit, 50-60 grit, or 80-100 grit abrasive surface.

Figure 9:
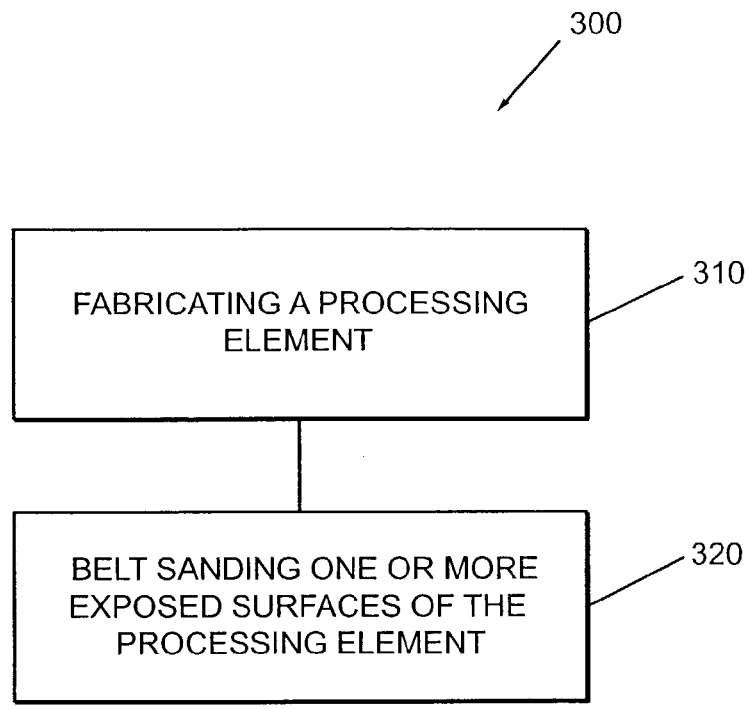
FIG. 9 presents a method of producing a processing element according to an embodiment of the present invention.

FIG. 9 presents a method of producing a processing element for use in a processing system, such as the ones described in FIGS. 1, 2A, and 2B. A flow diagram 300 begins in 310 with fabricating the processing element. The processing element can, for example, comprise a chamber liner, a deposition shield, an instrument shield, a baffle plate, a duct liner, etc. Additionally, for example, the processing element can comprise a door shield as described in FIGS. 4A-E, a pod shield as described in FIGS. 5A-E, or a pumping duct shield as described in FIGS. 7A-C. The processing element is formed from sheet metal or spun metal. For example, the fabrication of the processing element can further comprise at least one of machining, casting, polishing, forging, and grinding. Each processing element described above can be fabricated according to specifications set forth on a mechanical drawing.

In 320, one or more surfaces of the processing element, to be exposed to the processing environment during processing (exposed surfaces), are roughened to an average roughness Ra in excess of 250 mil (or 6.3 micron) using a belt sanding technique. The belt sanding technique can, for example, further comprise a roughening application to the one or more exposed surfaces of the processing element having a cross-hatched pattern.

Fabrication of each processing element can further comprise at least one of providing a surface anodization on one or more surfaces, providing a spray coating on one or more surfaces, or subjecting one or more surfaces to plasma electrolytic oxidation. For example, the spray coating can comprise at least one of $Al_2O_3$, Yttria ($Y_2O_3$), $Sc_2O_3$, $Sc_2F_3$, $YF_3$, $La_2O_3$, $CeO_2$, $Eu_2O_3$, and $DyO_3$. Methods of anodizing aluminum components and applying spray coatings are well known to those skilled in the art of surface material treatment.

Figure 10A:
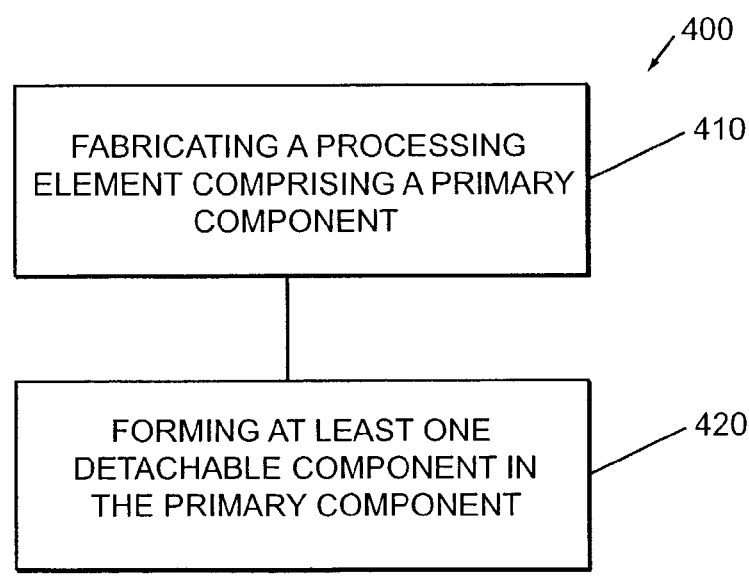
FIG. 10A presents a method of producing a processing element according to another embodiment of the present invention.

FIG. 10A presents a method of producing a processing element for use in a processing system, such as the ones described in FIGS. 1, 2A, and 2B. A flow diagram 400 begins in 410 with fabricating the processing element, wherein the processing element comprises a primary component. In 420, at least one detachable component is formed in the primary component. The processing element can, for example, comprise a chamber liner, a deposition shield, an instrument shield, a baffle plate, a duct liner, etc. Additionally, for example, the processing element can comprise a door shield as described in FIGS. 4A-E, a pod shield as described in FIGS. 5A-E, or a pumping duct shield as described in FIGS. 7A-C. The processing element is formed from sheet metal or spun metal. For example, the fabrication of the processing element can further comprise at least one of machining, casting, polishing, forging, and grinding. Each processing element described above can be fabricated according to specifications set forth on a mechanical drawing.

The detachable component can be coupled to the primary component via one or more attachment features. For example, the attachment feature can be formed by providing a narrow cut, such as that derived from a laser cutting system, along a line or curve delineating the primary component and the detachable component. Each attachment feature can, for example, range from 10 to 80 mil in width (i.e., 30 mil), and range from 10 to 160 mil in length (i.e., 60 mil). The detachable component can, for example, be coupled to a processing element, such as a door shield, for permitting the flexible use of the door shield with target assemblies of various sizes. Additionally, for example, the detachable component can comprise a punch-out (or knockout) and can be coupled to a processing element, such as a pod shield, for permitting flexible use of the pod shield with gas injection systems of different orientation (i.e. a right-hand system versus a left-hand system). Additionally, for example, the detachable component can, for example, be coupled to a pumping duct shield for permitting the flexible use of the pumping duct shield with pumping ducts of various sizes.

Figure 10B:
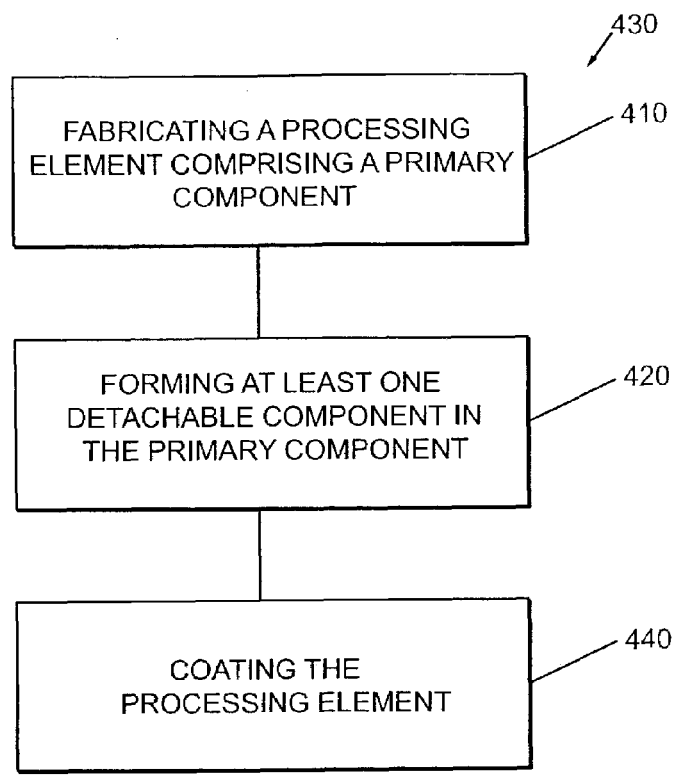
FIG. 10B presents a method of producing a processing element according to another embodiment of the present invention.

FIG. 10B presents another method of producing a processing element for use in a processing system, such as the ones described in FIGS. 1, 2A, and 2B. A flow diagram 430 begins in 410 with fabricating the processing element, wherein the processing element comprises a primary component, and, in 420, with forming at least one detachable component in the primary component. In 440, fabrication of each processing element can further comprise at least one of providing a surface anodization on one or more surfaces, providing a spray coating on one or more surfaces, or subjecting one or more surfaces to plasma electrolytic oxidation. For example, the spray coating can comprise at least one of Al2O3, Yttria (Y2O3), Sc2O3, Sc2F3, YF3, La2O3, CeO2, Eu2O3, and DyO3. Methods of anodizing aluminum components and applying spray coatings are well known to those skilled in the art of surface material treatment.

Figure 11:
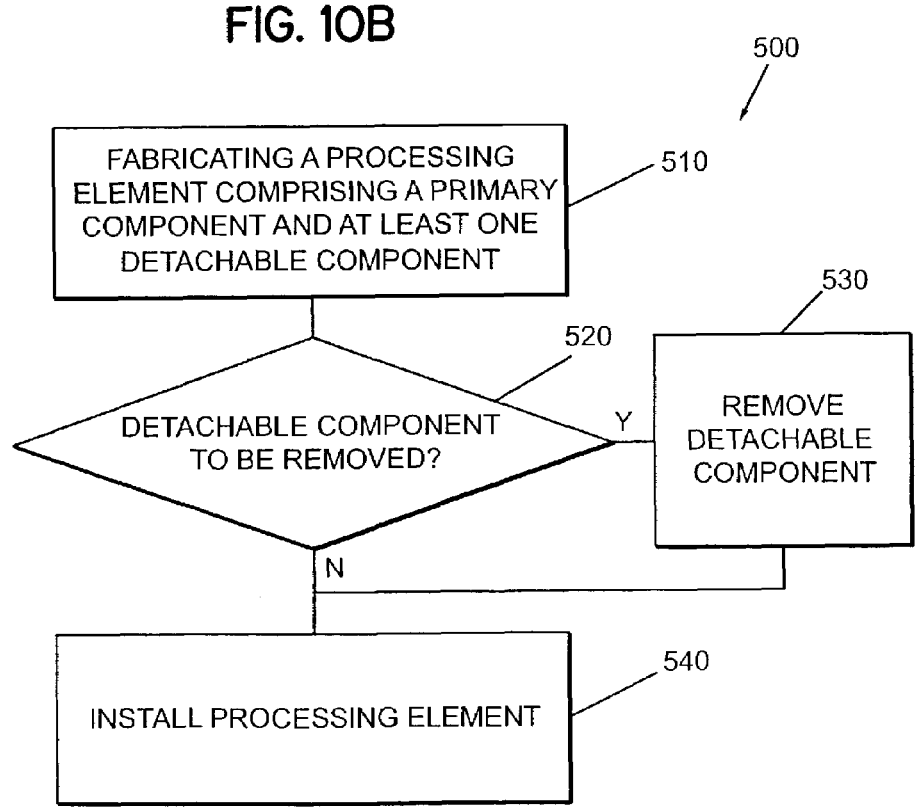
FIG. 11 presents a method of installing a processing element in a processing system according to another embodiment of the present invention.

FIG. 11 presents a method of using a processing element in a processing system, such as those described in FIGS. 1, 2A, and 2B. A flow diagram 500 begins in 510 with fabricating the processing element, wherein the processing element comprises a primary component and at least one detachable component. The processing element can, for example, comprise a chamber liner, a deposition shield, an instrument shield, a baffle plate, a duct liner, etc. Additionally, for example, the processing element can comprise a door shield as described in FIGS. 4A-E, a pod shield as described in FIGS. 5A-E, or a pumping duct shield as described in FIGS. 7A-C.

In 520, a determination is made whether to remove one or more of the at least one detachable components. If one or more of the at least one detachable components are to be removed, then they are removed and discarded in 530 and the processing element is installed within the processing chamber in 540. Otherwise, they are installed in the processing chamber without removal of one or more of the at least one detachable components.

In an example, the processing element is a door shield (FIG. 4A). If the processing system comprises a ten (10) inch diameter sputter target, then the detachable component described in FIGS. 4A-E is not removed prior to installation. If, however, the processing system comprises a twelve (12) inch diameter sputter target, then the detachable component described in FIGS. 4A-E is removed prior to installation. In another example, the processing element is a pod shield (FIG. 5A). If the processing system comprises a gas injection system having a right-hand side orientation, then the detachable gas injection punch-out (FIG. 5C) located on the right-hand side of the pod shield is removed prior to installation. If, on the other hand, the processing system comprises a gas injection system having a left-hand side orientation, then the detachable gas injection punch-out located on the left-hand side of the pod shield is removed prior to installation. Additionally, if an optional gas injection ring is employed, the detachable clearance punch-outs (FIG. 5D) are removed prior to installation. Furthermore, if the processing system comprises a gas injection system having a right-hand side orientation, then the detachable gas inject line clearance punch-out (FIG. 5E) is removed prior to installation. If, on the other hand, the processing system comprises a gas injection system having a left-hand side orientation, then the detachable gas inject line clearance punch-out is removed prior to installation. In yet another example, the processing element is a pumping duct shield. If the pumping duct shield is to be fitted with a pumping duct of smaller diameter, then the detachable component is removed prior to installation. If, however, the pumping duct shield is to be fitted with a pumping duct of larger diameter, then the detachable component is not removed prior to installation.

Figure 12B:
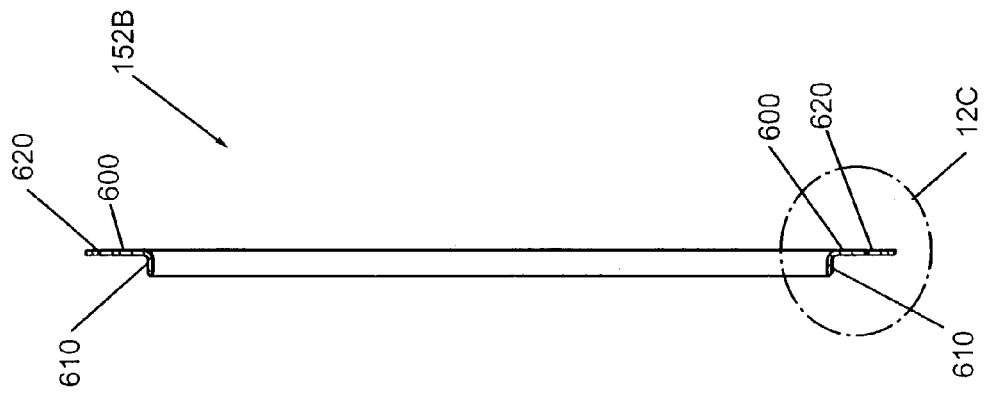
FIG. 12B presents a cross-sectional view of the dark space shield depicted in FIG. 12A.
Figure 12A:
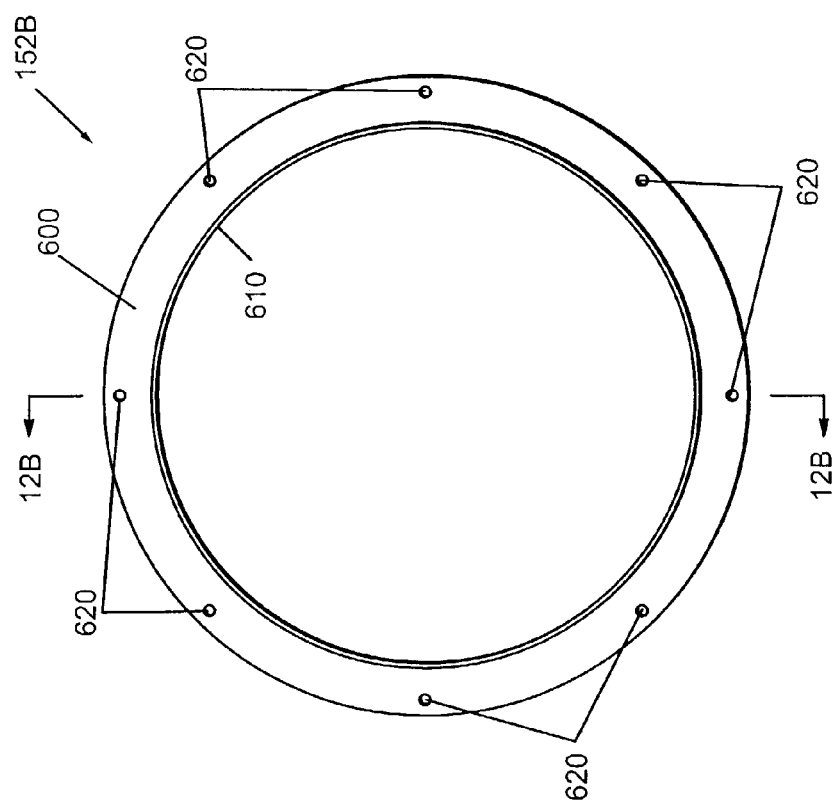
FIG. 12A presents a top view of a dark space shield according to an embodiment of the present invention.
Figure 12C:
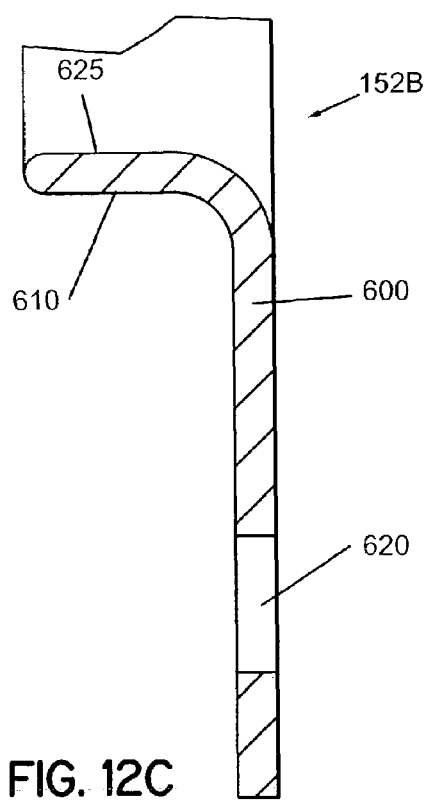
FIG. 12C presents an expanded view of the cross-sectional view of the dark space shield depicted in FIG. 12B.

Referring now to FIGS. 12A and 12B, a top view and cross-sectional view of the dark space shield 152B is presented. The dark space shield 152B can be a member of a shield assembly coupled to the target assembly and configured to surround and protect a peripheral edge of the sputter target mounted within the target assembly. As shown in FIG. 3A, the shield assembly can, for example, further comprise an adaptor shield 152A. The dark space shield 152B comprises a flange region 600 and a lip region 610, coupled thereto. As shown in FIG. 3A, the dark space shield 152B is coupled to the target assembly using fasteners as shown that extend through fastening holes 620 in dark space shield 152B, and is configured to surround the sputter target (not shown). By surrounding the peripheral edge of the sputter target, coupled to target assembly 135, a clearance space is formed between an inner surface 625 of 11$p$ region 610 of the dark space shield 152B and the outer edge of the target. This space can, for example, be less than 1 mm in order to prevent plasma from penetrating this space and eroding the peripheral edge of the sputter target. FIG. 12C shows an expanded view of the lip region 610 and the inner surface 625.

Figure 13C:
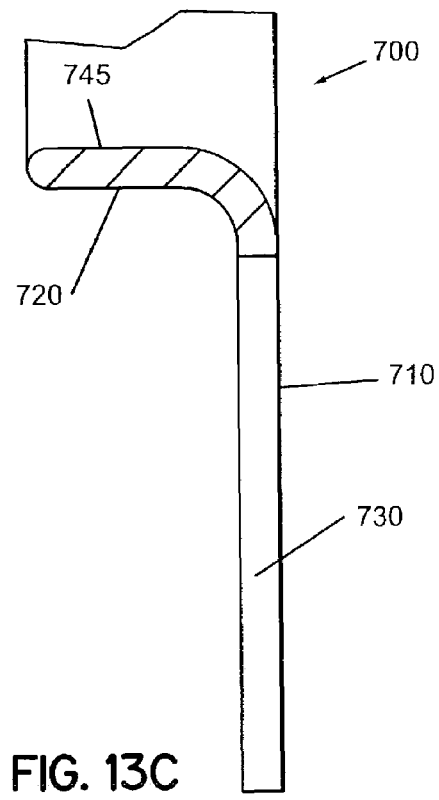
FIG. 13C presents an expanded view of the cross-sectional view of the dark space shield depicted in FIG. 13B.
Figure 13B:
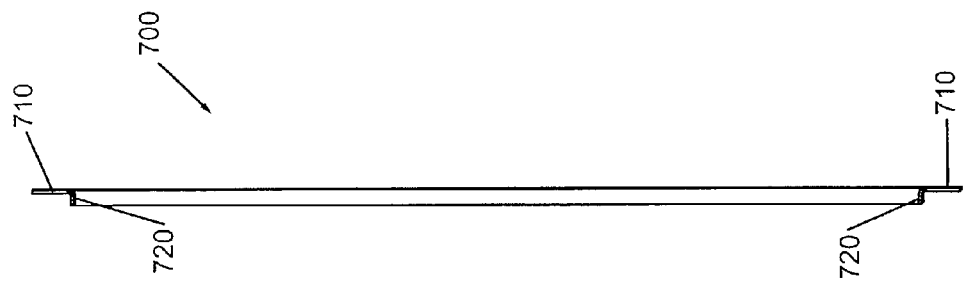
FIG. 13B presents a cross-sectional view of the dark space shield depicted in FIG. 13A.
Figure 13A:
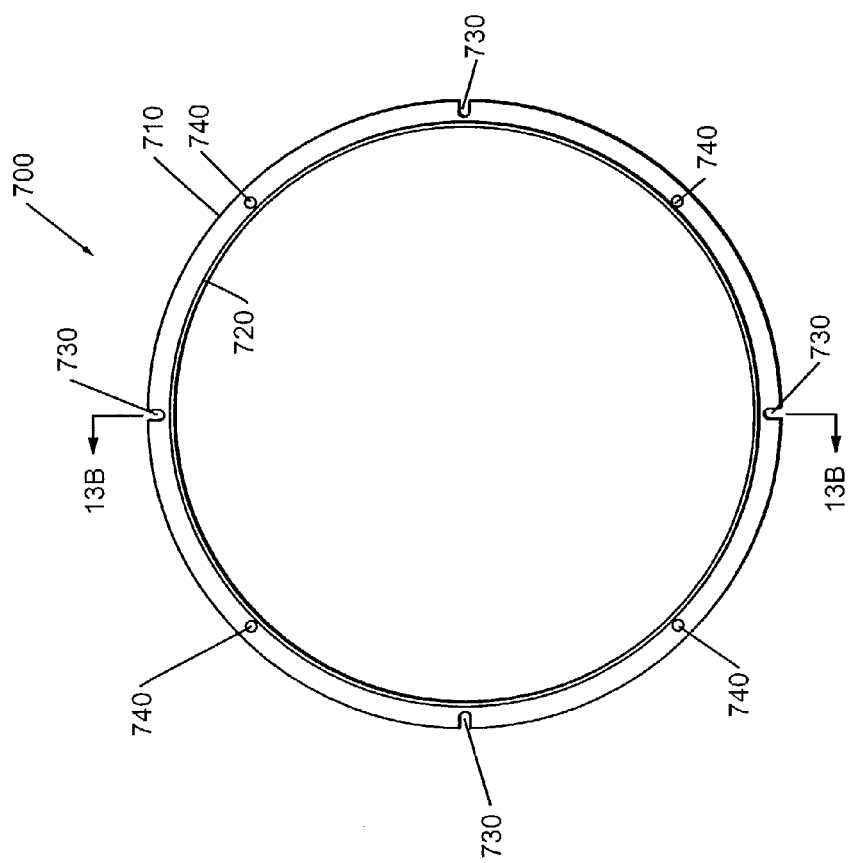
FIG. 13A presents a top view of a dark space shield according to another embodiment of the present invention.

In an alternate embodiment, referring now to FIGS. 13A and 13B, a top view and cross-sectional view of a dark space shield 700 is presented. The dark space shield 700 can be a member of a shield assembly coupled to the target assembly and configured to surround and protect a peripheral edge of the sputter target mounted within the target assembly, thereby combining both the traditional dark space shield and the adapter shield. The dark space shield 700 comprises a flange region 710, a lip region 720, and an adaptor region 730, coupled thereto. The adapter region 730 performs the function of a separate adapter shield. The dark space shield 700 is coupled to the target assembly using fasteners as shown that extend through fastening holes 740 in dark space shield 700, and is configured to surround the sputter target (not shown). By surrounding the peripheral edge of the sputter target, coupled to target assembly 135, a clearance space is formed between an inner surface 745 of lip region 720 of the dark space shield 700 and the outer edge of the target. This space can, for example, be less than 1 mm in order to prevent plasma from penetrating this space and eroding the peripheral edge of the sputter target. FIG. 13C shows an expanded view of the lip region 720 and the inner surface 745.

Referring now to FIGS. 14A and 14B, a top view and a cross-sectional view of the ring shield 155B are illustrated. The ring shield 155B can be a member of a shield assembly for protecting a substrate holder. The ring shield 155B comprises a flange region 630 and a lip region 640, coupled thereto. As shown in FIG. 3B, the ring shield 155B is coupled to the substrate holder shield 155C using fasteners as shown that extend through fastening holes 650, and is configured to protect the pod shield 154 and the substrate holder shield 155C. Additionally, ring shield 155B can further comprise clearance notches 655 to permit coupling an optional gas injection ring 155.

As illustrated in FIGS. 12A through 12C, FIGS. 13A through 13C, and FIGS. 14A and 14B, the dark space shield 152B and the ring shield 155B are fabricated from spun metal. The metal can, for example, comprise aluminum. This fabrication process can lead to a cost reduction in excess of 50%. Any of the above described dark space shields or ring shields can be fabricated for 200 mm, 300 mm, or greater diameter systems. Additionally, fabrication of the dark space shield 152B and the ring shield 155B can further comprise at least one of providing a surface anodization on one or more surfaces, providing a spray coating on one or more surfaces, or subjecting one or more surfaces to plasma electrolytic oxidation. For example, the spray coating can comprise at least one of Al2O3, Yttria (Y2O3), Sc2O3, Sc2F3, YF3, La2O3, CeO2, Eu2O3, and DyO3. Methods of anodizing aluminum components and applying spray coatings are well known to those skilled in the art of surface material treatment.

Although only certain exemplary embodiments of this invention have been described in detail above, those skilled in the art will readily appreciate that many modifications are possible in the exemplary embodiments without materially departing from the novel teachings and advantages of this invention. All such modifications are intended to be included within the scope of this invention.

Accordingly, the following is claimed.

The invention claimed is:

1. A door shield for use in a processing system of any one of two or more configurations, wherein said processing system comprises a processing chamber having an upper chamber portion and a lower chamber portion, wherein:
   the door shield is coupled to said upper chamber portion of said processing chamber, and comprises:
      a primary component; and
      a detachable component coupled to the primary component, wherein said processing element is configured for use in a first configuration of said processing system when said detachable component is retained with said primary component and said processing element is configured for use in a second configuration of said processing system when said detachable component is removed.

2. The door shield as recited in claim 1, wherein said processing system comprises at least one of a physical vapor deposition system, a chemical vapor deposition system, and an etch system.

3. The door shield as recited in claim 2, wherein said processing system comprises a physical vapor deposition system, a target assembly coupled to said processing chamber, a substrate holder for supporting a substrate coupled to said processing chamber, a pumping system, and a pumping duct coupling said pumping system to said processing chamber.

4. The door shield as recited in claim 3, wherein said detachable component comprises a detachable ring coupled to said door shield, wherein said detachable ring is retained when using said door shield with a first size of said target assembly and said detachable ring is removed when using said door shield with a second size of said target assembly.

5. The processing element as recited in claim 4, wherein said first size comprises a target assembly for substrate diameters less than 290 mm, and said second size comprises a target assembly for substrate diameters greater than 290 mm.

6. The door shield as recited in claim 1, further comprising a coating applied to at least one surface on said door shield.

7. The door shield as recited in claim 6, wherein said coating comprises at least one of a surface anodization, a spray coating, and a plasma electrolytic oxidation coating.

8. A door shield for use in a physical vapor deposition system, said physical vapor deposition system comprising a processing chamber having an upper chamber portion and a lower chamber portion, a target assembly coupled to said processing chamber, a substrate holder for supporting a substrate coupled to said processing chamber, a pumping system, and a pumping duct coupling said pumping system to said processing chamber, said door shield comprising:
   a primary component configured to be coupled to said upper chamber portion, said primary component being substantially rectangular and comprising a first rounded end and a second rounded end, wherein said second rounded end is configured to surround said target assembly; and
   a detachable component coupled to the primary component, said detachable component is substantially circular and is configured to be coupled to said primary component at a peripheral edge of said detachable component using at least one attachment feature,
   wherein said door shield is configured for use with a first size of said target assembly when said door shield comprises said primary component and said detachable component, and said door shield is configured for use with a second size of said target assembly when said door shield comprises said primary component.

9. The door shield as recited in claim 8 further comprising a coating applied to at least one surface on said door shield.

10. The door shield as recited in claim 9, wherein said coating comprises at least one of a surface anodization, a spray coating, and a plasma electrolytic oxidation coating.

11. The door shield as recited in claim 8, wherein said first size comprises a target assembly for substrate diameters less than 290 mm.

12. The door shield as recited in claim 8, wherein said second size comprises a target assembly for substrate diameters greater than 290 mm.

13. A shield for use in any one of two or more configurations in a processing system to protect surfaces thereof from deposits, wherein said processing system comprising a processing chamber having an upper chamber portion and a lower chamber portion, and wherein:
   the shield is either a door shield coupled to said upper chamber portion of said processing chamber, a pod shield coupled to said lower chamber portion of said processing chamber, or a pumping duct shield coupled to said pumping duct, and comprises:
      a primary component; and
      a detachable component coupled to the primary component,
   wherein said processing element is configured for use in a first configuration of said processing system when said detachable component is retained with said primary component and said processing element is configured for use in a second configuration of said processing system when said detachable component is removed.

14. The processing element as recited in claim 13, wherein:
   said detachable component is coupled to said primary component by one or more attachment features, said attachment features having been formed by cutting said processing element along a curve to delineate said detachable component from said primary component with the exception of the location of said attachment features.

15. The processing element as recited in claim 14, wherein said cutting has been performed using a laser cutting system.

16. The processing element as recited in claim 14, wherein said one or more attachment features comprise a width and a length, said width ranging from 10 to 80 mil, and said length ranging from 10 to 160 mil.

17. The shield as recited in claim 13, wherein said shield is a pod shield and said at least one detachable component comprises a first detachable gas injection punch-out and a second detachable gas injection punch-out removably coupled to said pod shield using at least one attachment feature, wherein said first gas injection punch-out is coupled to a right-hand side of said pod shield and said second gas injection punch-out is coupled to a left-hand side of said pod shield.

18. The shield as recited in claim 13, wherein said at least one detachable component comprises at least one detachable clearance punch-out to provide clearance for mounting a gas injection ring to said processing system, a first detachable gas inject line clearance punch-out to provide clearance for a gas inject line in a right-hand side orientation of said processing system, and a second detachable gas inject line clearance punch-out to provide clearance for a gas inject line in a left-hand side orientation of said processing system.

19. The processing element as recited in claim 13, wherein said shield is a pumping duct shield and said at least one detachable component comprises a detachable shield extension coupled to said pumping duct shield, said detachable shield extension being retained for use of said pumping duct shield in a first configuration of said pumping duct shield and said detachable shield extension being removed for use of said pumping duct shield in a second configuration of said pumping duct shield.

* * * * *

UNITED STATES PATENT AND TRADEMARK OFFICE
CERTIFICATE OF CORRECTION

PATENT NO. : 7,306,707 B2 Page 1 of 1
APPLICATION NO. : 10/454747
DATED : December 11, 2007
INVENTOR(S) : John Lawson et al.

It is certified that error appears in the above-identified patent and that said Letters Patent is hereby corrected as shown below:

In Col. 12, line 10, "surface 625 of 11p region 610 of" should read --surface 625 of lip region 610 of--.

Signed and Sealed this

Second Day of December, 2008

JON W. DUDAS
*Director of the United States Patent and Trademark Office*